United States Patent
Das et al.

(10) Patent No.: US 6,618,421 B2
(45) Date of Patent: Sep. 9, 2003

(54) HIGH REPETITION RATE GAS DISCHARGE LASER WITH PRECISE PULSE TIMING CONTROL

(75) Inventors: Palash P. Das, Vista, CA (US); Jennan Yu, San Diego, CA (US); Stuart L. Anderson, San Diego, CA (US); Helmut Schillinger, Munich (DE); Tobias Pflanz, Munich (DE); Claus Strowitzki, Gilching (DE); Claudia A. Hartmann, Mering (DE); Stephan Geiger, Herbertshausen (DE); Brett D. Smith, Cody, WY (US); William N. Partlo, Poway, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/837,035

(22) Filed: Apr. 18, 2001

(65) Prior Publication Data

US 2002/0012376 A1 Jan. 31, 2002

Related U.S. Application Data

(63) Continuation-in-part of application No. 09/748,316, filed on Oct. 22, 2000, which is a continuation-in-part of application No. 09/684,629, filed on Oct. 6, 2000, which is a continuation-in-part of application No. 09/608,543, filed on Jun. 30, 2000, and a continuation-in-part of application No. 09/370,739, filed on Aug. 9, 1999, now Pat. No. 6,151,346, which is a continuation-in-part of application No. 09/118,773, filed on Jul. 18, 1998, now Pat. No. 5,936,988.

(51) Int. Cl.[7] ............................................... H01S 03/22

(52) U.S. Cl. ............................. 372/55; 372/58; 372/38
(58) Field of Search .......................... 372/25, 100, 37, 372/101, 55, 22, 36

(56) References Cited

U.S. PATENT DOCUMENTS

| | | | | |
|---|---|---|---|---|
| 4,276,516 | A | | 6/1981 | Congdon .................... 331/94.5 |
| 4,553,244 | A | * | 11/1985 | Benedict et al. ............ 372/108 |
| 4,660,204 | A | * | 4/1987 | Dewhirst et al. ............ 372/100 |
| 4,847,854 | A | | 7/1989 | Van Dijk ..................... 372/92 |
| 5,317,589 | A | * | 5/1994 | Ogawa et al. ............... 372/101 |
| 5,658,535 | A | | 8/1997 | Thayer, III .................. 422/129 |
| 6,128,323 | A | * | 10/2000 | Myers et al. .................. 372/37 |
| 6,240,112 | B1 | * | 5/2001 | Partlo et al. ................... 372/25 |

* cited by examiner

Primary Examiner—Paul Ip
Assistant Examiner—Hung Vy
(74) Attorney, Agent, or Firm—William Cray

(57) ABSTRACT

A high repetition rate, compact, modular gas discharge, ultraviolet laser. The laser is useful as a light source for very rapid inspections of wafers in an integrated circuit fabrication process. It is also useful for reticle writing at very rapid rates. A preferred embodiment operates at pulse repetition rates of 1000 to 4000 Hz and is designed for round-the-clock production line operation. This preferred embodiment comprises a pulse control unit which controls the timing of pulses to an accuracy of less than 4 nanoseconds. Preferred embodiments of this gas discharge laser can be configured to operate with a KrF gas mixture, an ArF gas mixture or an $F_2$ gas mixture, each with an approximate buffer gas, producing 248 nm, 197 nm or 157 nm ultraviolet light pulses.

10 Claims, 11 Drawing Sheets

HIGH REPETITION RATE GAS DISCHARGE LASER WITH PRECISE PULSE TIMING CONTROL

The present invention is a continuation-in-part of Ser. No. 09/748,316, filed Dec. 22, 2000, Ser. No. 09/684,629 filed Oct. 6, 2000 and Ser. No. 09/370,739, filed Aug. 9, 1999, now U.S. Pat. No. 6,151,346 which was a continuation-in-part of Ser. No. 09/118,773, filed Jul. 18, 1998 now U.S. Pat. No. 5,936,988 and Ser. No. 09/608,543, filed Jun. 30, 2000. This invention relates to gas discharge lasers and in particular to high repetition rate gas discharge lasers.

BACKGROUND OF THE INVENTION

Electric Discharge Gas Lasers

Electric discharge gas lasers are well known and have been available since soon after lasers were invented in the 1960s. A high voltage discharge between two electrodes excites a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric gas discharge laser and have been known as such since the mid 1970s. A description of excimer lasers, useful for integrated circuit lithography, are described in U.S. Pat. No. 5,023,884 issued Jun. 11, 1991 entitled "Compact Excimer Laser" and U.S. Pat. No. 5,991,324 issued Nov. 23, 1999 entitled "Reliable, Modular, Production Quality Narrow-Band KrF Excimer Laser". Both of these patents have been assigned to Applicants' employer, and these patents are hereby incorporated herein by reference. The excimer lasers described in the above patents are high repetition rate pulse lasers. In FIG. 1, the principal elements of the laser 10 are shown (FIG. 1 corresponds to FIG. 1 in Patent '884). The discharges 22 are between two long (about 23 inches) electrodes 18 and 20 spaced apart by about ⅝ inch. Repetition rates of prior art lasers, like the ones described, are typically within the range of about 100 to 2000 pulses per second. These high repetition rate lasers are usually provided with a gas circulation system. In the above referred to laser, this is done with a long squirrel-cage type fan 46, having blades 48 as shown in FIG. 1 and in FIG. 2 which is FIG. 7 in Patent '884. The fan blade structure is slightly longer than the electrodes 18 and 20 and provides sufficient circulation so that at pulse rates between 100 to 2000 Hz, the discharge disturbed gas between the electrodes is cleared between pulses. The gas used in the laser contains fluorine which is extremely reactive. The fan rotor driving fan shaft 130 is sealed, within the same environmental system provided by housing structure members 12 and 14, by sealing member 136 as explained at column 9, line 45 of Patent '884, and the motor stator 140 is outside sealing member 136 and thus protected from the corrosive action of the fluorine gas. Heat in the gas which is produced by the electric discharge and the rapid circulation of the gas is removed by finned, water-cooled heat exchanger 58. An important use of these lasers is as a light source for integrated circuit lithography. The nominal output wavelength of these lasers is determined by the gas mixture. A KrF excimer laser operates at about 248 nm; an ArF excimer laser operates at about 193 nm and an $F_2$ excimer laser operates at about 157 nm.

Pulse Power

Electric discharge gas lasers of the type described in U.S. Pat. No. 5,023,884 utilize an electric pulse power system shown in FIG. 3 to produce the electrical discharges, between the two electrodes. In such prior art systems, a direct current power supply 22 charges a capacitor bank called "the charging capacitor" or "$C_0$" 42 to a predetermined and controlled voltage called the "charging voltage" for each pulse. The magnitude of this charging voltage may be in the range of about 500 to 1000 volts. After $C_0$ has been charged to the predetermined voltage, a solid state switch 46 is closed allowing the electrical energy stored on $C_0$ to ring very quickly through a series of magnetic compression circuits comprising capacitor banks 52, 62 and 82 and inductors 48, 54 and 64 and a voltage transformer 56 to produce high voltage electrical potential in the range of about 16,000 volts across the electrode which produces the discharge which lasts about 50 ns.

In prior art lithography laser systems, the time between the closing of the solid state switch and the discharge is in the range of about 5 microseconds; however, the charging of $C_0$ accurately to the pre-selected voltage has in the past required about 400 microseconds which was quick enough for pulse repetition rates of less than about 2,000 Hz. The reader should understand that accurate charging of $C_0$ is very important since the control of the voltage level on $C_0$ is in these systems the only practical control the laser operator has on the discharge voltage which in turn is the primary determiner of laser pulse energy. For laser light sources used for integrated circuit fabrication the precise timing of the pulses has not been critically important since for both stepper machines and scanning machines target areas on the wafer are illuminated with a number of pulses such as about 20 to 40 pulses during an interval of a few milliseconds.

Reticles

Reticles used for integrated circuit lithography contain the patterns to be applied to the silicon wafer as a part of the process to create the integrated circuit. The pattern on the reticle is typically 3 or 4 times larger than the corresponding image on the wafer. Nevertheless, the dimension on the reticle are still very small, i.e., a few hundreds of nanometers. These patterns on the reticles typically in the past have been created with electron beams, and both reticles and wafers typically have been inspected with visible light microscopes.

What is needed are excimer laser systems optimized for reticle creation and inspection of both reticles and wafers.

SUMMARY OF THE INVENTION

The present invention provides a high repetition rate, compact, modular gas discharge, ultraviolet laser. The laser is useful as a light source for very rapid inspections of wafers in an integrated circuit fabrication process. It is also useful for reticle writing at very rapid rates. A preferred embodiment operates at pulse repetition rates of 1000 to 4000 Hz and is designed for round-the-clock production line operation. This preferred embodiment comprises a pulse control unit which controls the timing of pulses to an accuracy of less than 4 nanoseconds. Preferred embodiments of this gas discharge laser can be configured to operate with a KrF gas mixture, an ArF gas mixture or an $F_2$ gas mixture, each with an approximate buffer gas, producing 248 nm, 197 nm or 157 nm ultraviolet light pulses.

BRIEF DESCRIPTION OF THE DRAWINGS

FIG. 2a shows a cross section of a part of a prior art fan system for the prior art laser.

DETAILED DESCRIPTION OF PREFERRED EMBODIMENTS

First Preferred Embodiment

Figure 1:
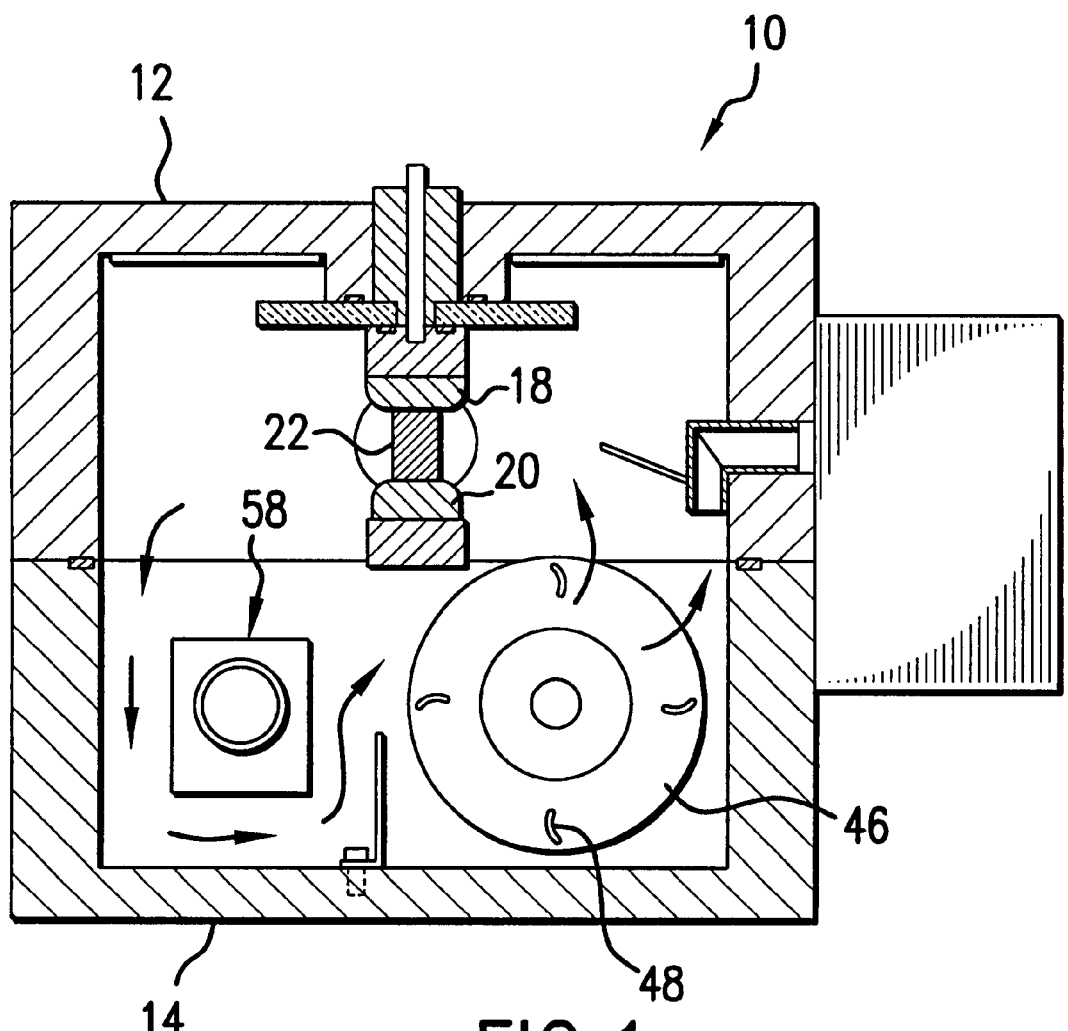
FIGS. 1 and 2 show a cross section drawings of a prior art laser chamber.
Figure 2:
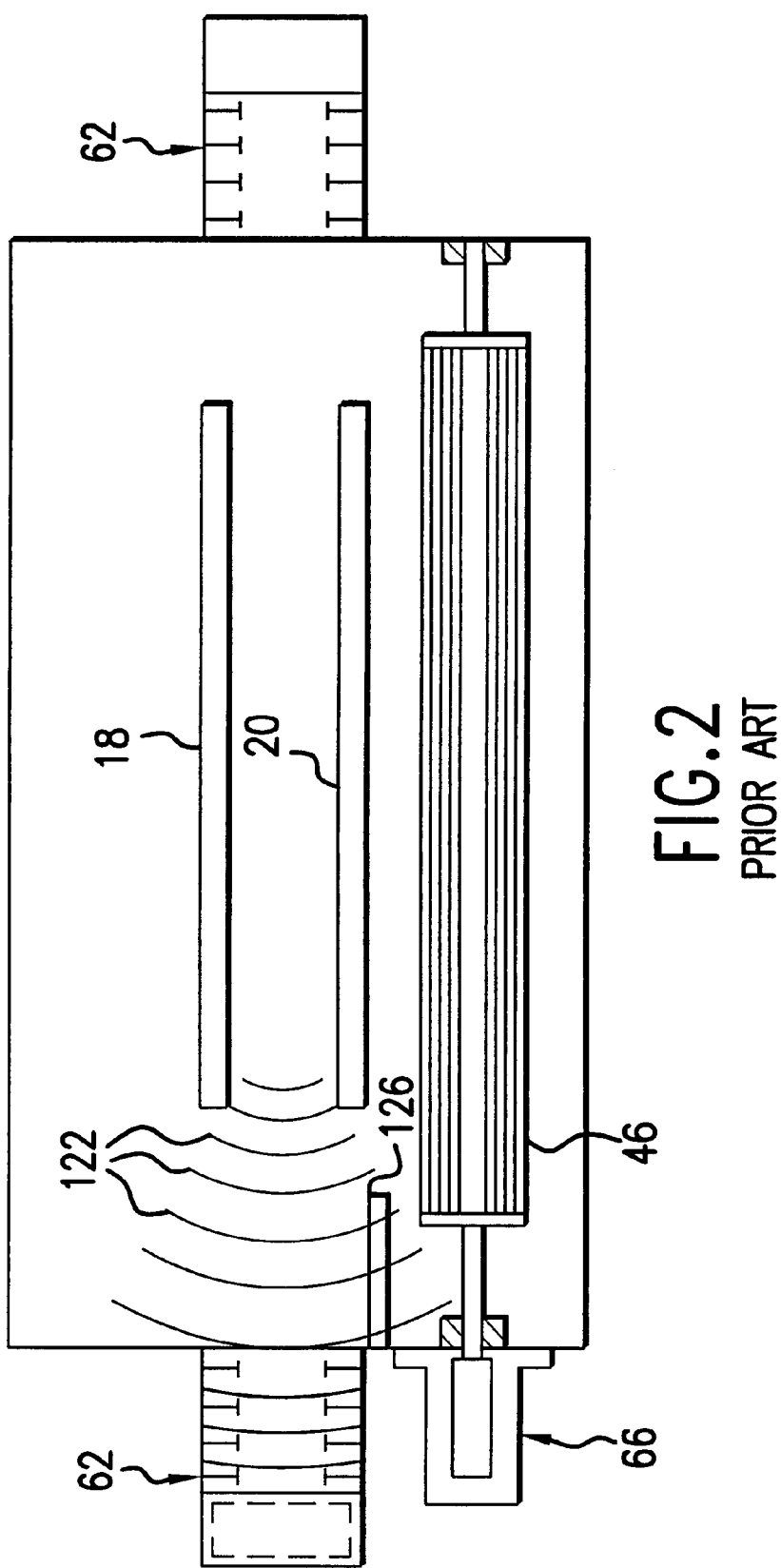
Figure 3:
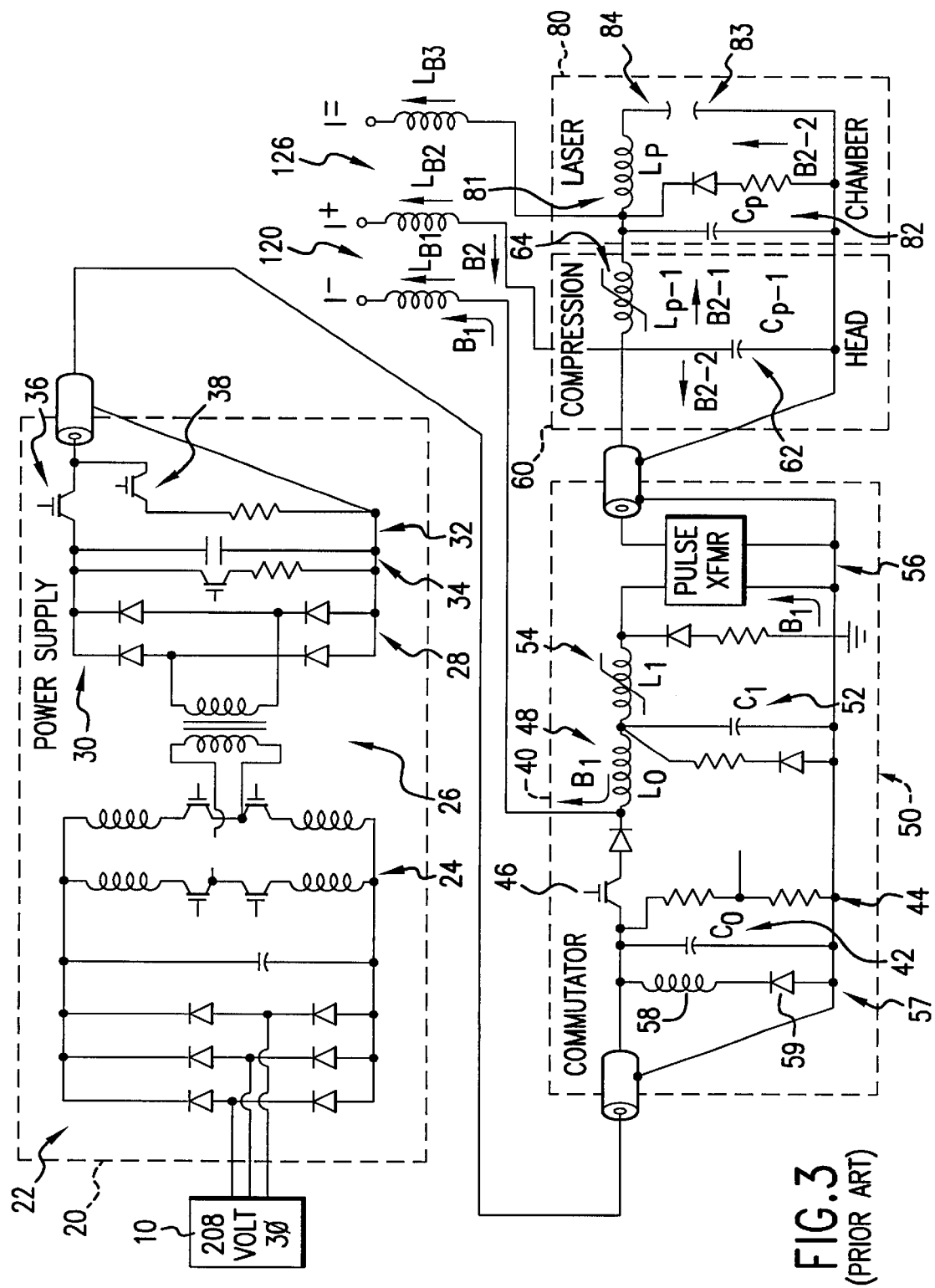
FIG. 3 shows a circuit diagram of a prior art pulse power system.
Figure 5:
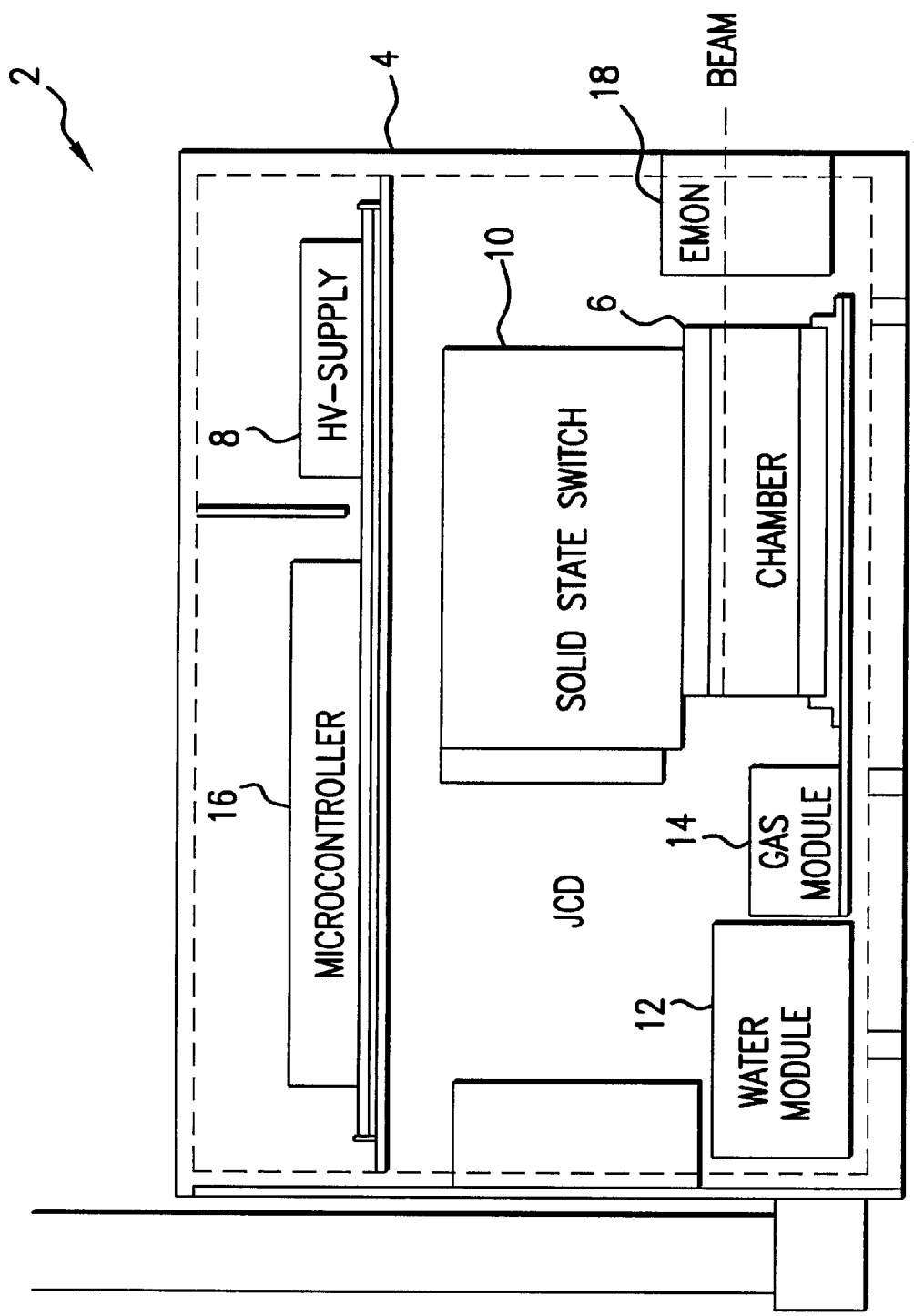
FIG. 5 is a block diagram of a preferred embodiment of the present invention.

A first preferred embodiment of the present invention is shown in block diagram in FIG. 5. This laser system 2 is a modular and the principal modules are assembled for easy replacement in laser cabinet 4 and are indicated in FIG. 1. These modules are laser chamer 6, high voltage power supply 8, solid state magnetic switch module 10, cooling water module 12, gas module 14, control module 16 and energy monitor module 18. The laser system is described in detail below:

The Laser System

This laser system is designed for production line operation. These lasers are expected to operate virtually continuously at pulse rates in the range of 1000 Hz to 4000 Hz or greater, 24 hours per day, seven days per week, 52 weeks per year with minimal downtime for maintenance. Estimated usage is 20 billion pulses per year. The laser must be built for minimum downtime for maintenance. It is designed in many ways like a production line lithography laser system such as the one described in U.S. Pat. No. 5,991,324 but there are many important differences in this laser. The principal differences are that the present system does not need to be line narrowed, and pulse energies are somewhat lower than those required for lithography. However, individual pulse energy specifications including the timing of the pulse (at least when used for mask writing) is much tighter than those for the lithography lasers. Also, coherence of the laser beam in this laser is substantially reduced as compared to the prior art lithography lasers. The laser system is much smaller, about one-half the size of typical prior art high repetition rate lithography lasers.

Principal Uses

The laser system of the present invention is currently expected to be used primarily for reticle writing and wafer inspection.

Reticle Writing

Figure 4:
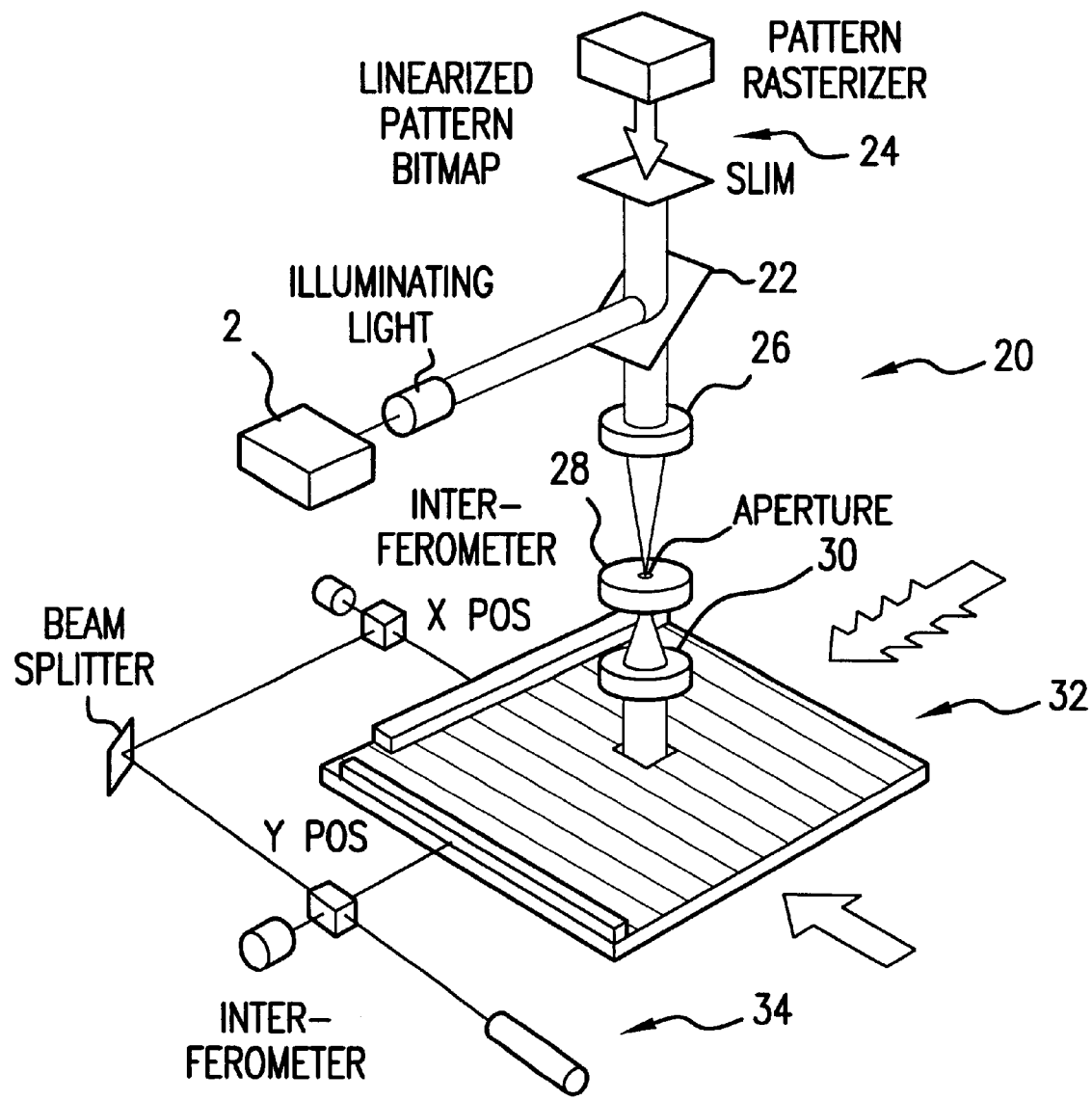
FIG. 4 shows a system for using the present invention as a light source for reticle writing.

The present invention is particularly useful for fabrication of reticles for use in integrated circuit lithography. A preferred technique for reticle writing using the present invention is shown in FIG. 4. This technique uses the light from the laser system of the present invention to print a pattern on a thin chrome film deposited on a transparent substrate. The patterns may be created with the laser UV light either by vaporizing the chrome with the light or by using a resist which is cured by the UV light and a subsequent acid treatment to remove the unprotected chrome. These techniques are described in detail in High Performance Laser Pattern Generation Using Spacial Light Modulator (SLM) and Deep UV Radiation presented by Torbjorn, Sandstrom, et al. at SPIE 2001 Microlithography Conference in Santa Clara, Calif. It is also described in summary form as follows by reference to FIG. 4. In this mask writer system 20, light from an excimer laser 2 of the present invention is reflected by beam splitter 22 up to spacial light modulator 24 which spacially modulates the light at extremely rapid rates. This is done with a high array of extremely small mirror surfaces of extremely small mirror surfaces such as a million mirror array (1000×1000) which is computer controlled to reflect desired patterns through beam splitter 22, lens 26, aperture 28 and lens 30 to produce the desired pattern on reticle 32. The position of reticle 32 is precisely controlled by interferometer controlled positioning system 34.

Mask Inspection

The other principal use of the laser of the present invention is for wafer inspection. In this application, a laser beam from the laser described herein is used to illuminate a small portion (about 100 $\mu$m square to about 1 mm square) of a wafer and the reflected light is imaged onto a pixel array of a CCD camera. The CCD camera pattern is then compared by a processor to an expected pattern to determine if the wafer has been processed correctly. This inspection is expected to be part of an automated integrated circuit fabrication line, so that the wafer is automatically stepped into position for inspection, automatically scanned during the inspection and then stepped onto the next step after completion of inspection. A typical wafer comprises an integrated circuit surface area of about 100 $cm^2$. Therefore, when 100 $\mu$m view sites are used, a total of about 1 million digital photographs must be taken of the wafer for a complete inspection. If one photograph is taken during each pulse and the laser is operating at 3000 Hz, the inspection will require about 333 seconds or about 6 minutes.

Laser System Details

Laser Chamber

Figure 6:
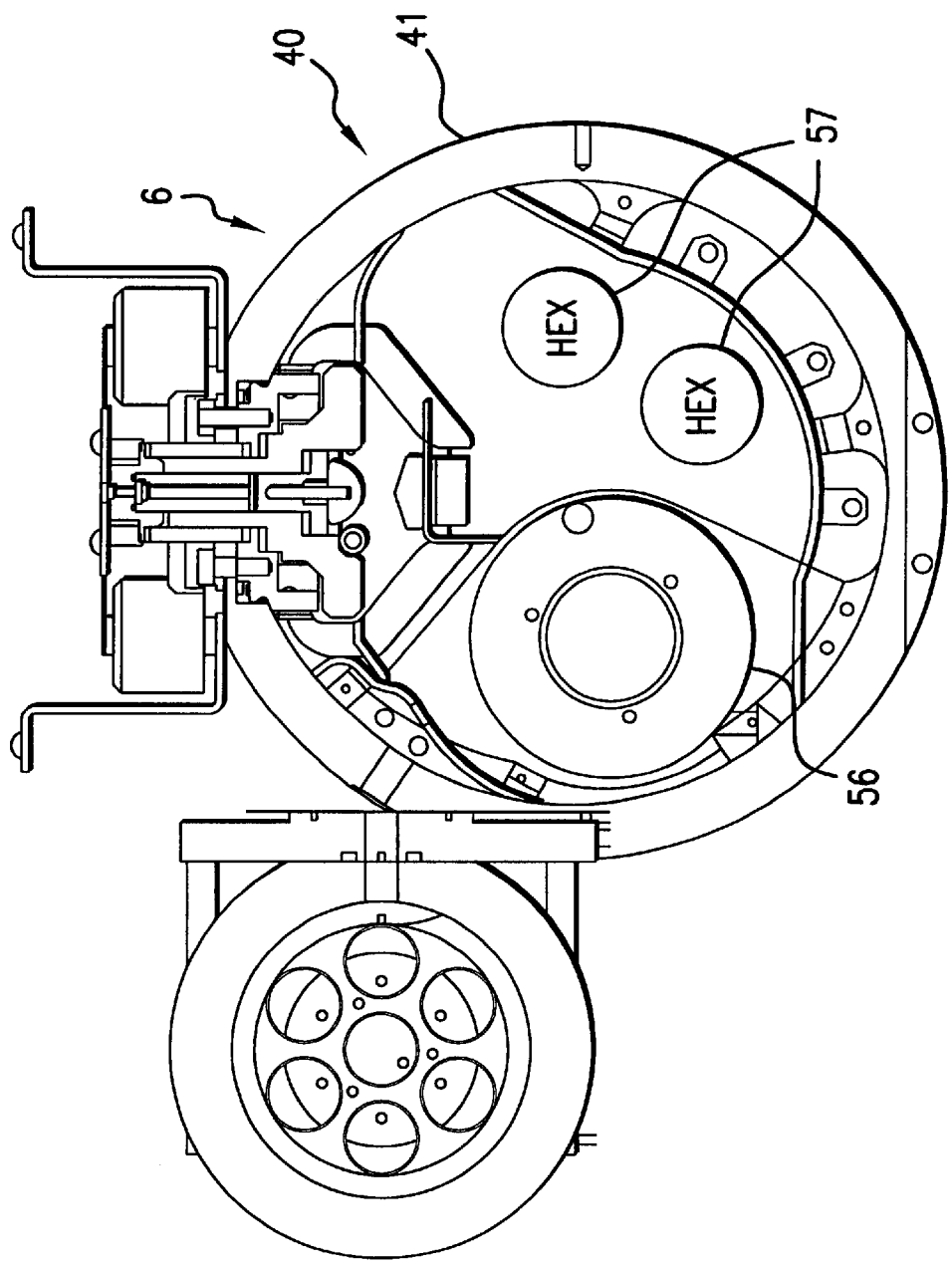
FIG. 6 is a cross section drawing of a laser chamber of a preferred embodiment.
Figure 7:
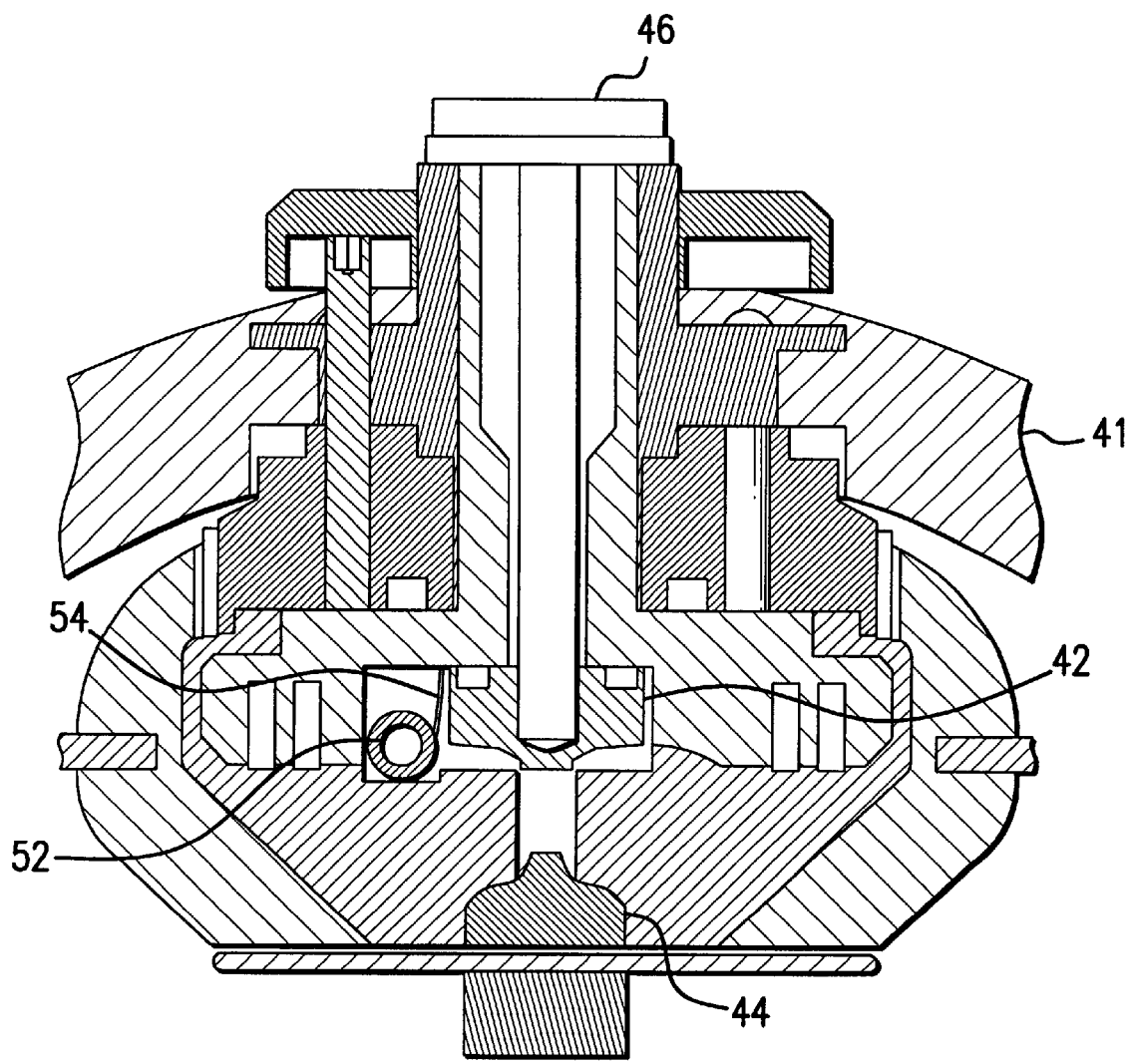
FIG. 7 is a cross section drawing of a portion of the FIG. 6 laser chamber.

A cross-sectioned drawing showing important features of a laser chamber module 6 of a preferred embodiment of the present invention is shown in FIG. 6. An enlarged view of the discharge region is shown in FIG. 7. The chamber is enclosed in a pressure vessel 40 comprised of an extruded diameter aluminum tube 41 with aluminum end flanges. The wall thickness of the tube is 20 mm or 30 mm for design pressures of between 400 kPa and 600 kPa. Electrodes 42 and 44 are 40 cm in length and are spaced apart by about 6 mm and produce a discharge width of about 4 mm Electrode 42, referred to as the anode is electrically connected by 5 feed-through rods 46 to a high voltage lens 48 which is energized by peaking capacitor bank 50. Electrode 44 is referred to as the anode and it is electrically positioned at ground on anode support bar 52. In this embodiment, 20 current return vanes 54 provide a low inductance look back to the ground side of peaking capacitor bank 50. A single preionizer tube 52 similar to those used in prior art lithography lasers is comprised of an alumina hollow cylinder having a ground rod in the center and a electrically conducting flange 54 running the length of the tube and held against the tube with a spring force applies the high voltage potential of the peaking capacitor to the outside surface of the preionizer generally a plasma on the surface at the start of each discharge to produce preionization in the discharge region between the two electrodes. Laser gas is circulated in the chamber 40 with 3-inch diameter fan 56 which is driven by a single DC water cooled motor. The rotor for the motor is sealed inside the laser gas environment using a thin can sealing unit so that the motor stator is not exposed to the laser gas environment. This motor design is described in detail in U.S. patent application, Ser. No. 09/748,316 which is incorporated by reference herein. The bearing for the fan shaft are ceramic bearings as described in U.S. Pat. No. 6,208,675. (If water cooling is not needed, the motor described in the '675 patent could be used.)

The laser gas is maintained within desired temperature ranges of about 30° C. to 50° C. with one or more finned water cooled heat exchanger 57 of the type described in U.S. Pat. No. 6,128,323.

Pulse Power

The pulse power supply for this preferred embodiment is an improved version of the pulse power supply described in U.S. Pat. No. 5,142,166.

FIG. 7 is an electrical drawing of a preferred pulse power system for providing the electrical pulses needed for producing discharges between electrode 42 and 44. This drawing does not show the charging unit utilized which is in the preferred embodiment a resonant charger of the type described in U.S. Pat. No. 6,028,872. Resonant chargers of this type can charge $C_0$ up to 1500 volts at rates of 4000 charges per second.

The charge placed on $C_0$ is controlled by a pulse energy controller to an accuracy of about 0.1 percent. The accuracy of the charge on $C_0$ is important because the charge on co determines the discharge energy. Upon a command from control module 16 switch TRI is closed discharging $C_0$ through diodes $D_1$ saturable inductor 60 and inductors $L_1$ to charge up capacitor bank $C_1$. Capacitor $C_1$ is discharged resonantly through saturable inductor MSC1 to provide an approximately 1500 volt pulse at the primary side of pulse transformer 62. Pulse transformer 62 is a $\frac{1}{12}$ to 1 pulse transformer of the general type described in U.S. Pat. No. 5,142,166. This pulse transformer amplifies the pulse voltage by a factor of about 12, for example, from 1500 volts to 18,000 volts or from about 2000 volts to 24,000 volts. This transformer is comprised of six hollow spool shaped mandrels, each wrapped with Metglass to form six cores, each of which has a single primary winding in parallel with the primary winding of the other cores. The secondary of the transformer is comprised of two-coaxial conductors radially insulated from each other but connected in series and passing through the center of six cores.

The output voltage of transformer 62 charges capacitor bank $C_{p-1}$ and it discharges through saturable inductor MSC2 to charge peaking capacitor $C_p$ which in turn provides the electrical potential to produce the described discharge across electrodes 42 and 44. In this preferred embodiment, preferred values of capacitance and inductance for the components of the pulse supply system of FIG. 7 are as follows:

| | |
|---|---|
| $C_0$ capacitance = | 1.2 μF |
| Saturable inductor 60 saturated inductance = | 500 nH |
| Inductor $L_1$ saturated inductance = | 700 nH |
| $C_1$ saturated inductance = | 1.27 μF |
| Saturable inductor MSC1 saturated inductance = | 14 nH |
| $C_{p-1}$ saturated inductance = | 8.8 nF |
| Saturable inductor MSC2 saturated inductance = | 80 nH |
| $C_p$ saturated inductance = | 8.8 nF |

This circuit provides for energy recovery using the technique described in U.S. Pat. No. 5,729,562. Bias circuits shown at 64 and 66 bias the saturable inductors in the circuit to initially oppose electrical energy flow from charging capacitor $C_0$ to the electrodes. However, after the closing of switch TR1 the inductors become saturated after a time to permit energy to flow forward to the electrodes. Due to a mismatch electrons flow across the discharge first from cathode 42 to anode 44 and then immediately backward across the discharge region from anode 44 to cathode 42 to oppositely charge $C_p$. Since all saturable inductors continue to be forward conducting for a few microseconds after the start of the pulse. The unspent pulse energy rings back through the circuit all the way to $C_0$ to place a charge on $C_0$ opposite to that applied by the resonant charger. That charge is immediately reversed by charge reversing circuit 66 all as described in U.S. Pat. No. 5,729,562.

Head Inductance

Figure 8:
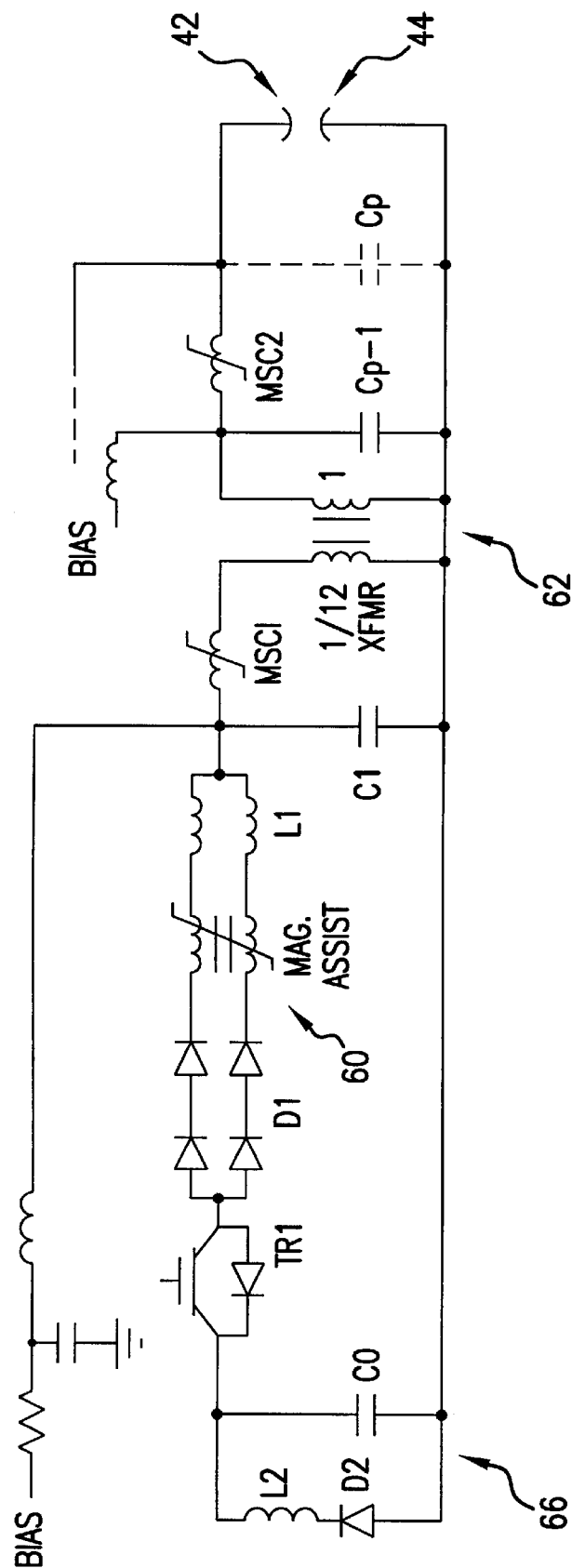
FIG. 8 is an electrical drawing of a pulse power system for a preferred embodiment.
Figure 9:
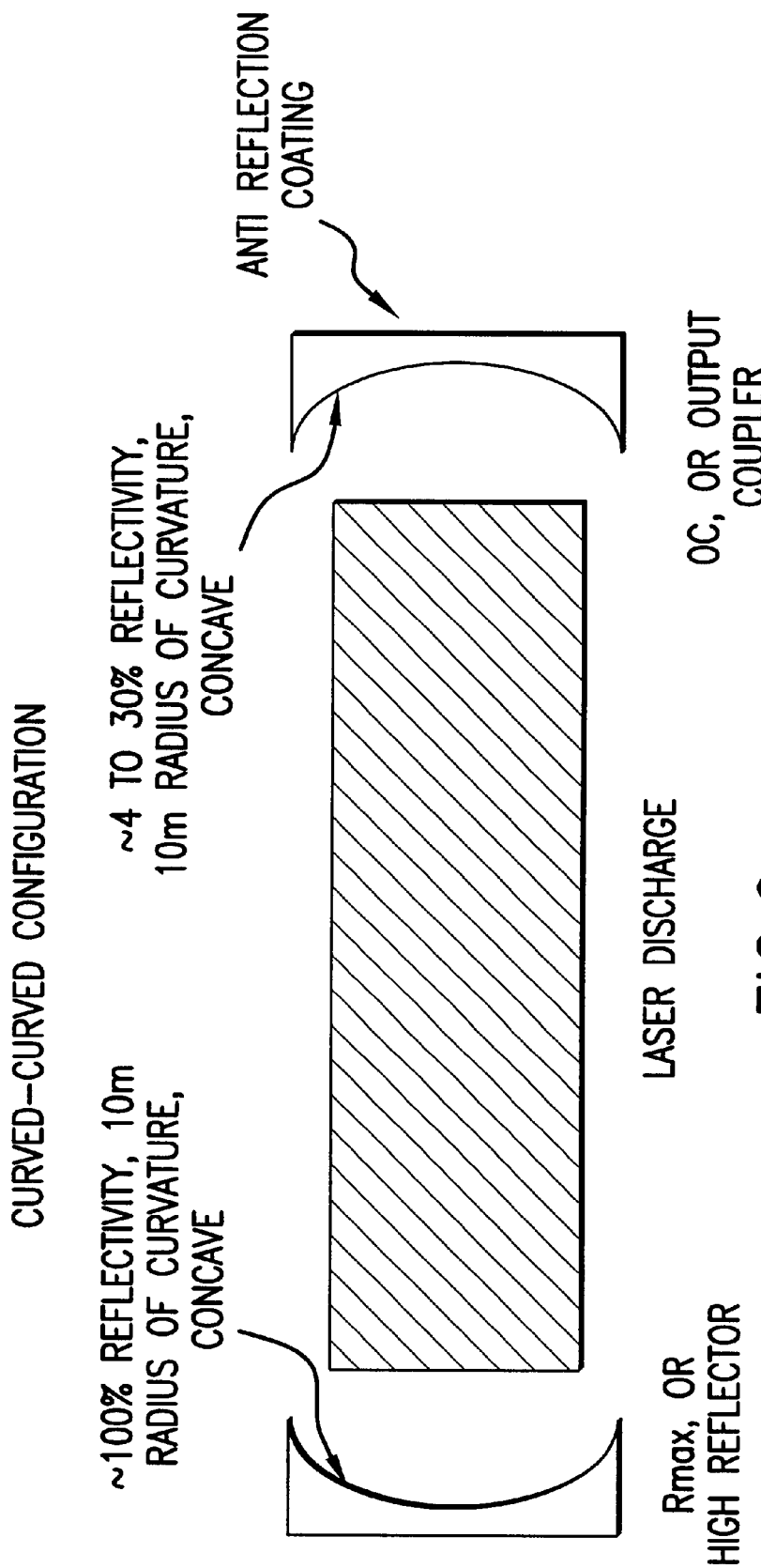
FIG. 9 shows a preferred resonant cavity.
Figure 10:
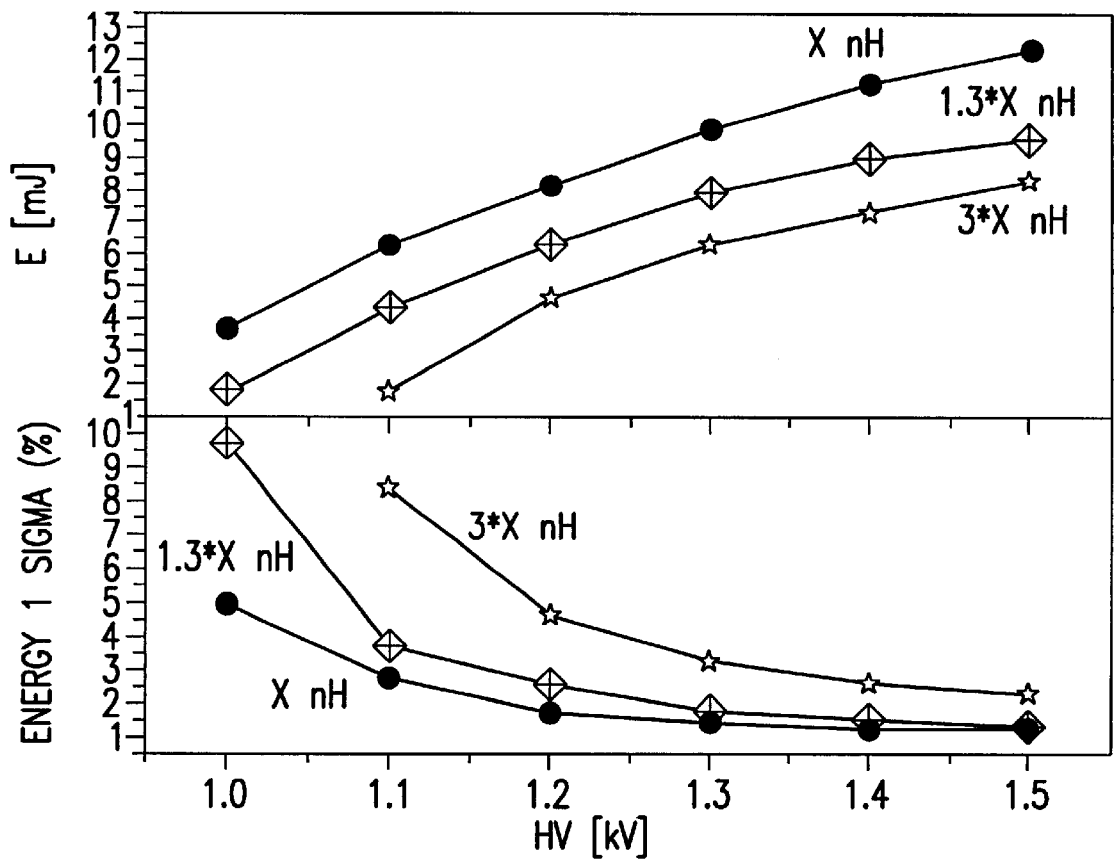
FIG. 10 shows the effects of reduced laser head induction.
Figure 11:
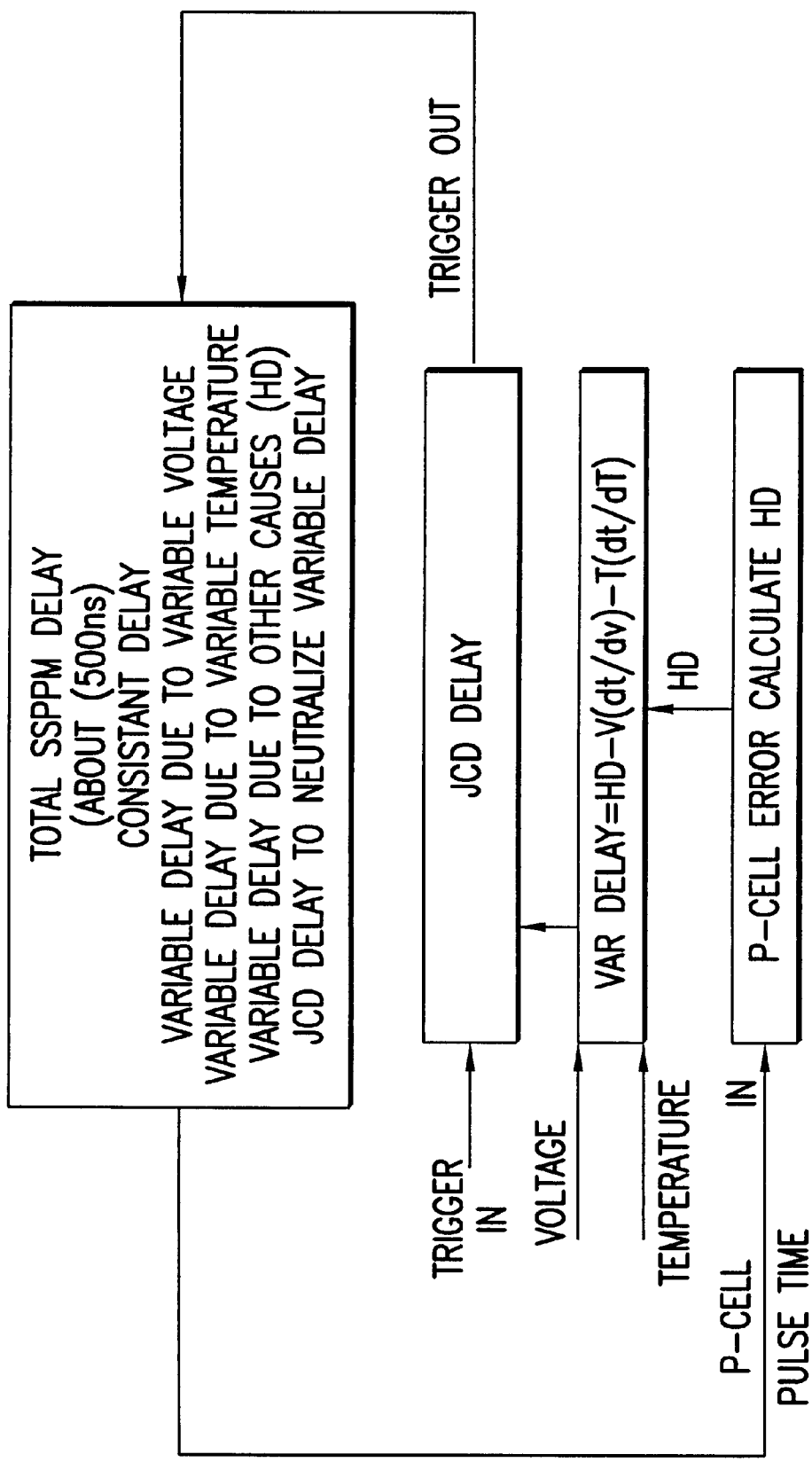
FIG. 11 shows a technique for jitter control.

Embodiments of the present invention operate with substantial improvements in efficiency due to reduction in the induction of the portion of the pulse power circuit including Cp and the electrodes 42 and 44, shown at 70 in FIG. 8. This reduction has been achieved by utilizing five feedthrough copper rods to connect the high voltage bus of the Cp capacitor bank to anode 42 and twenty curved nickel plated stainless steel plates to function as a current return to return current from anode 44 to the ground plate of the Cp capacitor bank. These changes have resulted in a reduction in the discharge induction of this circuit to less than 5 nH. The effect of this reduction on both pulse energy and energy stability is shown in the graphs of FIG. 9 where the actual induction is compared with a 30% and a 300% increase in the induction. These higher values are typical of induction values of this portion of pulse power circuits of prior art gas discharge lasers.

Pulse Monitor

Preferred embodiments of the present invention include pulse energy monitor 18 as shown in FIG. 5. A preferred monitor is a very fast photodiode similar to that described in U.S. Pat. No. 6,128,323. The output of this photodiode is sent to microcontroller 16 which uses the output to select the charging voltage for the next pulse and if necessary to correct for jitter as described below. The energy and jitter of each pulse is monitored and the results are compared in real time to specification limits. If either parameter is outside desired limits, appropriate action may be immediately taken.

When the laser system is used for inspection automatic control equipment is preferably programmed to repeat the inspection when an out of specification pulse energy or jitter is measured. If the frequency or extent of out of specification occurrences exceeds a predetermined level, corrective maintenance is called for. When the system is used for reticle writing, out of specification pulse energy or jitter may ruin the reticle. Therefore, in one embodiment controls for the laser system indicates a warning when out of specification information is detected. This information may be utilized to require special post operation inspection of the reticle.

The pulse energy monitor shown at 18 in FIG. 5 may also be incorporated into a pulse energy correction loop such as that described in U.S. Pat. No. 5,852,621, "Pulse Laser with Pulse Energy Trimmer". This technique measures the pulse energy, forces the output beam into a delay loop then trims a portion of the energy off the pulse in order to achieve the desired output.

Another alternative would be to use the general technique described in '621 to reflect away any bad pulse either due to out of specification pulse energy or jitter. This would permit the reticle writing system to back up and write again the portion represented by the bad pulse or pulses.

Jitter Compensation

As indicated in FIG. 4 and the description of the reticle writing equipment provided above, patterns created by mirror array 24 are written on target 32 as target 32 is positioned by positioning equipment 34. Mirror array positioning is very fast and the mirror segments are repositioned and in place at the beginning of each pulse which pulses are produced at rates of, for example, 3000 pulses per second. However, target 32 typically moves at continuous rates at, for example, at 100 mm/second (i.e., 0.1 nm/ns). Microcontroller thus must control the timing of the pulses so that the pulse energy is deposited in the desired location of the target. Since dimensions of the feature on the reticle are in the range of about 100 nm to 200 nm or less, it is important that the timing of the pulses is accurate enough to permit pulse energy to be deposited within a range of about 10 to 20 nm or less of the desired location. Since the target is currently being moved at rates of about 0.1 nm/ns, and will be moved at a faster rate in the future, the timing of the pulses needs to be accurate to within 100 to 200 ns and preferably to within 10 to 20 ns. Errors in pulse timing are called "jitter".

For the above reasons, the timing of pulses for reticle writing is much more critical than the timing of the pulses for integrated circuit lithography where sections of a wafer are exposed to about 15 to 50 pulses and the actual timing of the pulses needs to be accurate only to several microseconds.

This embodiment of the present invention provides a jitter control technique called a jitter compensation device (JCD) that assures that the pulse timing is accurate within about 10–20 ns. The light delay from an input trigger depends on voltage of solid state switched pulsed power module. The higher the charging voltage the shorter the delay between trigger and laser pulse. Delay between trigger to light also depends on the temperature of the magnetics inside the pulse power system. Thus, the delay between trigger to light is a function of voltage and temperature. The higher the temperature of the magnetic devices in the pulse power system, the shorter the delay between trigger and pulse. But fixed voltage and temperature, the natural pulse-to-pulse variation of the light pulse with the input trigger is small, about +/−5 ns.

Thus, in a preferred embodiment after a trigger from the user, the jitter control delays sending the trigger to the solid state pulse power of the laser by an amount corresponding to the laser's operating voltage and the temperature of the magnetics, so that the timing of the resulting pulse is accurate to within about 20 ns.

In another embodiment, the pulse controller adjusts the timing of the pulse for variations in charging voltage based on the specified charging voltage for the up coming pulse. In this embodiment, no direct correction for temperature variation is provided. However, a correction is made to the timing based on a timing error measured from the previous pulse. Since temperature of the magnetic components vary slowly, this pulse timing feedback technique in effect compensates for slowly varying temperature effects and at the same time provides compensation for other more suitable effects.

This particular embodiment makes the feedback correction using a technique which applies a full 100% correction for large timing errors such as greater than 20 ns but for smaller timing errors such as, for example, less than 20 ns a correction of only 25% is applied. This smaller percentage correction avoids oscillations about zero error.

This particular embodiment also employs a trick to achieve a 1 nanosecond resolution with a wide dynamic range using a digital counter with a 40 MHz crystal oscillator. The 40 MHz oscillator provides clock signals at 25 ns intervals but these signals are utilized to charge an approximately linear analog capacitive charging circuit. The voltage on the capacitor is then read to determine time accurate to about 1.0 ns.

Resonant Cavity

Preferred embodiments of the present invention utilize a curved-curved resonant cavity configuration. This configuration is displayed in FIG. 8. As shown in FIG. 8 the resonant cavity consists of an $R_{max}$ mirror and a partially reflecting mirror for the output coupler. Both mirrors have a concave curvature of about 10 meters which has the effect of producing a very incoherent excimer laser beam which is substantially divergent. The $R_{max}$ mirror has a reflectance of about 100% and the output coupler has a reflectance of about 4–30% on the inside side of the output coupler and an anti-reflective coating on the outside side.

Various modifications may be made to the present invention without altering its scope. Those skilled in the art will recognize many other possible variations. For example, operation at very high repetition rates and high duty factors may require additional cooling of the laser gas and other components of the laser including the optical components, the pulse power components and the fan motor.

Accordingly, the above disclosure is not intended to be limiting and the scope of the invention should be determined by the appended claims and their legal equivalents.

We claim:

1. A high repetition rate production quality gas discharge laser system with jitter control, said system comprising:
    A) a laser chamber comprising:
        1) a laser gas,
        2) a pair of elongated electrodes defining a discharge region,
        3) a fan for recirculating said laser gas between said electrodes,
        4) a heat exchanger for removing heat from said laser gas;
    B) a pulse power system for providing high voltage electrical pulses to produce discharges across said electrodes at repetition rates of 1000 Hz or greater
    C) a controller means for controlling jitter of all or substantially all of said discharges to an accuracy of within 10 to 20 ns or less.

2. A laser system as in claim 1 wherein said repetition rate is about 2000 Hz or greater.

3. A laser system as in claim 1 wherein said repetition rate is about 3000 Hz or greater.

4. A laser system as in claim 1 wherein said repetition rate is about 4000 Hz or greater.

5. A laser system as in claim 1 wherein said laser gas is comprised of krypton, fluorine, and a buffer gas and said system is configured to produce laser light at wavelengths of about 248 nm.

6. A laser system as in claim 1 wherein said laser gas is comprised of argon, fluorine and a buffer gas and said system is configured to produce light at wavelengths at about 193 nm.

7. A laser system as in claim 1 wherein said laser is comprised of fluorine and a buffer gas and said system is configured to produce light at wavelengths of about 157 nm.

8. A laser system as in claim 1 wherein said system comprises two mirrors defining a resonant cavity one of said mirrors having high reflectivity at wavelength of laser beams produced by said laser system and the other of said mirrors being a partially reflecting mirror and configured to function as an output coupler, both mirrors being concave mirrors.

9. A laser system as in claim 8 wherein said partially reflecting mirror has a reflectivity at said wavelengths in the range of 4% to 30%.

10. A laser system as in claim 8 wherein each of said mirrors has a concave curvature of about 10 meters.

* * * * *